US009831346B1

(12) United States Patent
Zang et al.

(10) Patent No.: US 9,831,346 B1
(45) Date of Patent: Nov. 28, 2017

(54) FINFETS WITH AIR-GAP SPACERS AND METHODS FOR FORMING THE SAME

(71) Applicant: GLOBALFOUNDRIES, INC., Grand Cayman (KY)

(72) Inventors: Hui Zang, Hopewell Junction, NY (US); Min-Hwa Chi, Hopewell Junction, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 15/220,990

(22) Filed: Jul. 27, 2016

(51) Int. Cl.
| H01L 29/78 | (2006.01) |
| H01L 23/522 | (2006.01) |
| H01L 23/532 | (2006.01) |
| H01L 29/66 | (2006.01) |
| H01L 21/28 | (2006.01) |
| H01L 21/285 | (2006.01) |
| H01L 21/768 | (2006.01) |

(52) U.S. Cl.
CPC ...... *H01L 29/785* (2013.01); *H01L 21/28247* (2013.01); *H01L 21/28518* (2013.01); *H01L 21/7682* (2013.01); *H01L 23/5226* (2013.01); *H01L 23/5329* (2013.01); *H01L 23/53295* (2013.01); *H01L 29/6656* (2013.01); *H01L 2029/7858* (2013.01)

(58) Field of Classification Search
CPC .......... H01L 29/66795; H01L 29/0649; H01L 29/6656
See application file for complete search history.

(56) References Cited

U.S. PATENT DOCUMENTS

| 9,397,008 | B1* | 7/2016 | Tung | H01L 21/823437 |
| 2012/0037962 | A1* | 2/2012 | Breyta | H01L 21/31144 257/288 |
| 2015/0069532 | A1* | 3/2015 | Xie | H01L 29/66545 257/410 |
| 2015/0255556 | A1* | 9/2015 | Cheng | H01L 29/7813 257/332 |
| 2016/0359021 | A1* | 12/2016 | Kim | H01L 29/66795 |
| 2016/0372415 | A1* | 12/2016 | Siew | H01L 27/0886 |
| 2016/0379891 | A1* | 12/2016 | Park | H01L 21/823475 257/401 |

OTHER PUBLICATIONS

Goodyear, Andrew L., et al., "High Resolution Inductively Coupled Plasma Etching of 30 nm Lines and Spaces in Tungsten and Silicon"; J. Vac. Sci. Technol. B 18(6), Nov./Dec. 2000; pp. 3471-3475.

Schwalke, U., et al., "Corner-Parasitics-Free Low-Cost Trench Isolation"; IEEE Electron Device Letters; vol. 20, No. 11, Nov. 1999.

(Continued)

*Primary Examiner* — Marc Armand
*Assistant Examiner* — Shannon Yi
(74) *Attorney, Agent, or Firm* — Scully Scott Murphy and Presser; Frank DiGiglio

(57) ABSTRACT

Fin field effect transistors (FinFETs) include air-gaps between adjacent metal contacts and/or between metal contacts and the transistor gate. The air-gaps are formed during non-conformal deposition of an isolation dielectric in conjunction with a metal-first process to form the conductive structures.

11 Claims, 11 Drawing Sheets

(56) References Cited

OTHER PUBLICATIONS

Suzuki, Mieko, et al., "A Fully Planarized Multilevel Interconnection Technology Using Selective TEOS-Ozone APCVD"; IEDM, 1992, pp. 293-296.
Takase Akihiro, et al., "Highly Selective Si3N4/SiOC Etching Using Dual Frequency Superimposed RF Capacitively Coupled Plasma"; Japanese Journal of Applied Physics, vol. 45, No. 7, 2006; pp. 5954-5959.

* cited by examiner

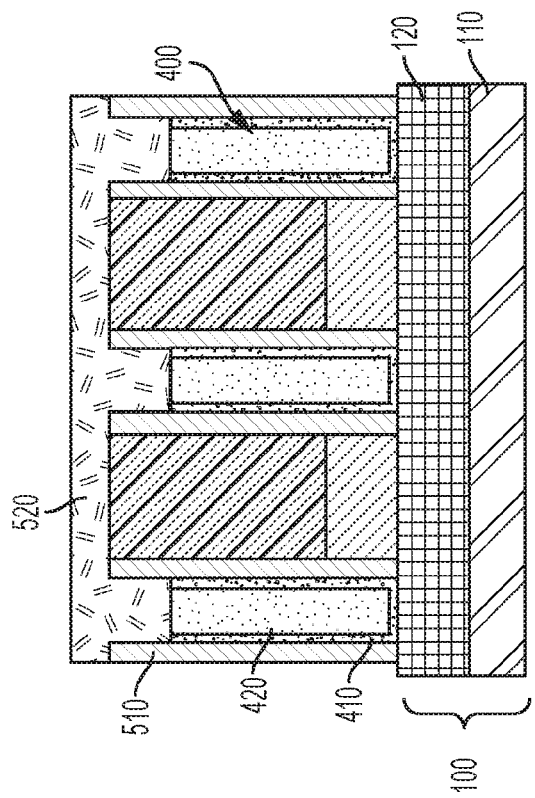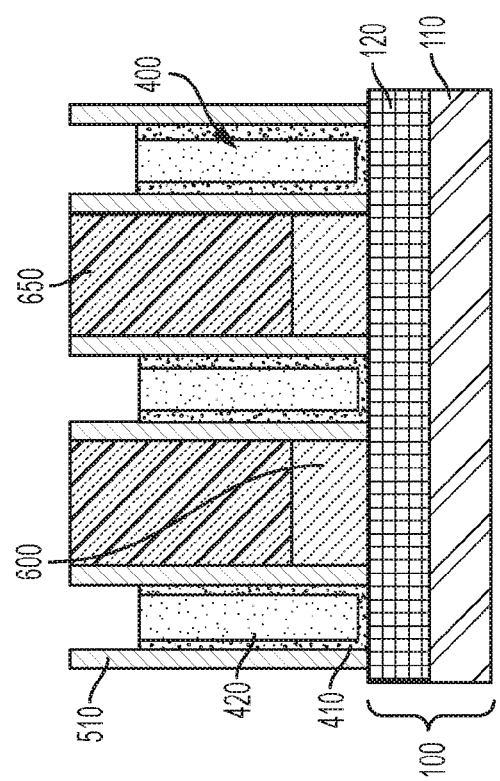
FIG. 3A
FIG. 3B

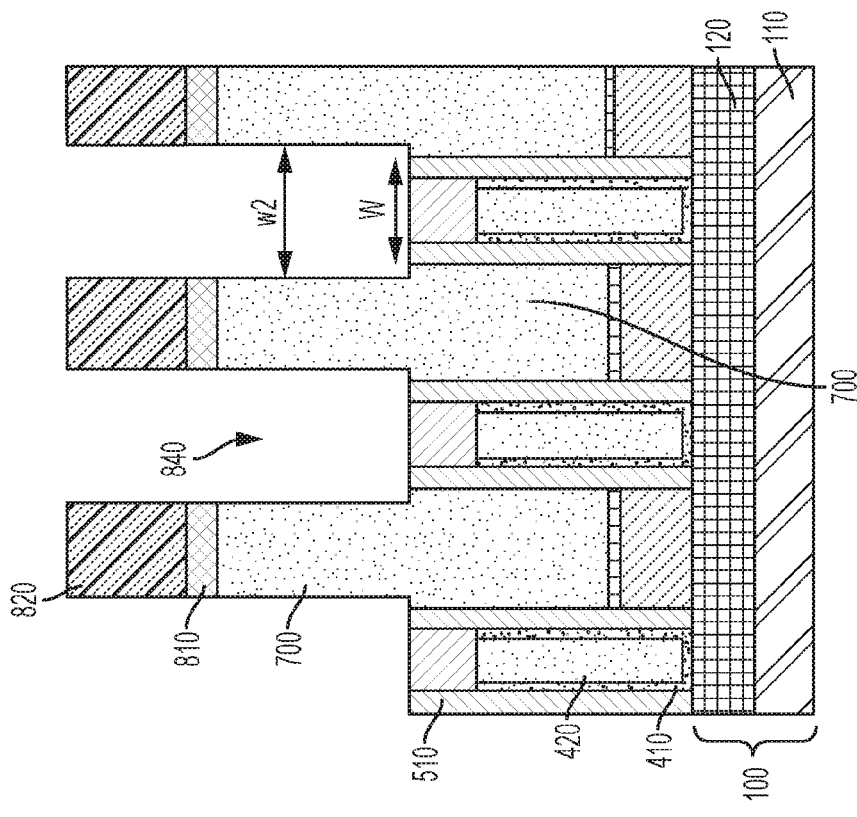
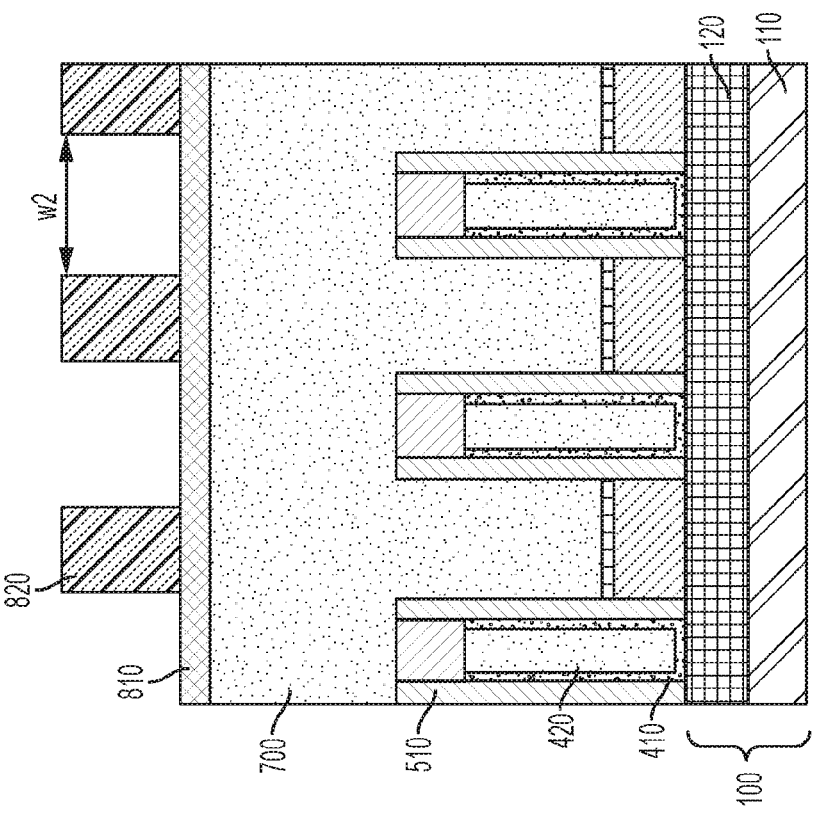

US 9,831,346 B1

FINFETS WITH AIR-GAP SPACERS AND METHODS FOR FORMING THE SAME

BACKGROUND

The present application relates generally to the manufacture of semiconductor devices, and more specifically to the formation of air-gaps for electrical isolation and minimization of parasitic capacitance and inductive coupling within advanced FinFET nodes, such as between adjacent metal contacts and between metal contacts and transistor gates.

Conventional methods for forming contact metallization use successive etch and deposition steps to first form contact vias within an interlayer dielectric. The contact vias are then filled with a conductive material. However, the robustness and reproducibility of such a process is being challenged by decreasing device dimensions where, for example, patterning limitations at contact-to-contact spacings of less than 50 nm and contact-to-gate spacings of less than 20 nm at a 7 nm node can result in high leakage currents and electrical shorts, due at least in part to insufficient dielectric isolation between adjacent conductive structures and residual conductive material that bridges the gap between conductors. While an additional recess etch of the metallization material(s) may be used to remove surface residues, such additional processing disadvantageously adds additional manufacturing steps to the process.

SUMMARY

It is recognized that there is a need for cost-effective integration methods to provide effective electrical isolation at advanced nodes.

In accordance with embodiments of the present application, disclosed is a method for forming air-gaps around the gate architecture of a fin field effect transistor. The air-gaps can be formed in conjunction with the deposition of an isolation dielectric layer, and can reside over the top as well as over the sides of the gate. The air-gaps provide effective inter-metal isolation.

Specifically, the disclosed method involves first forming a metal layer such as a tungsten layer on a surface to be contacted, etching the metal layer to open isolation apertures and define metal contacts, and then backfilling the isolation apertures with a dielectric layer. Non-conformal deposition of the dielectric layer can be used to form the air-gaps over the top and/or over exposed sidewalls of the surface to be contacted. Advantageously, the metal-first method involves no additional masking or etching steps.

A method of forming a semiconductor device includes forming a gate structure over a channel region of a semiconductor fin with a source region and a drain region present on opposing sides of the channel region. Dielectric spacers are formed over sidewalls of the gate structure and a dielectric cap is formed over the top of the gate structure. A conductive layer is formed over the dielectric cap and over the source and drain regions between adjacent dielectric spacers, and an aperture is then formed through the conductive layer to expose a surface of the dielectric cap. A conformal or non-conformal dielectric layer is formed within the aperture.

A semiconductor device, such as a fin field effect transistor (FinFET) includes a semiconductor fin disposed over a semiconductor substrate and a gate structure disposed over a channel region of the fin. Source and drain regions are arranged on opposing sides of the channel region. Dielectric spacers are disposed over sidewalls of the gate structure and a dielectric cap is disposed over the gate structure top. A conductive layer is formed over the source region and the drain region between adjacent dielectric spacers. An isolation dielectric having an air gap is disposed at least over the gate structure. The isolation dielectric may extend over the sidewall spacers between the gate and the conductive layer.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which:

FIGS. 3A-3I illustrate an example process for forming air-gaps proximate to the gate of a fin field effect transistor according to various embodiments;

DETAILED DESCRIPTION

Figure 1:
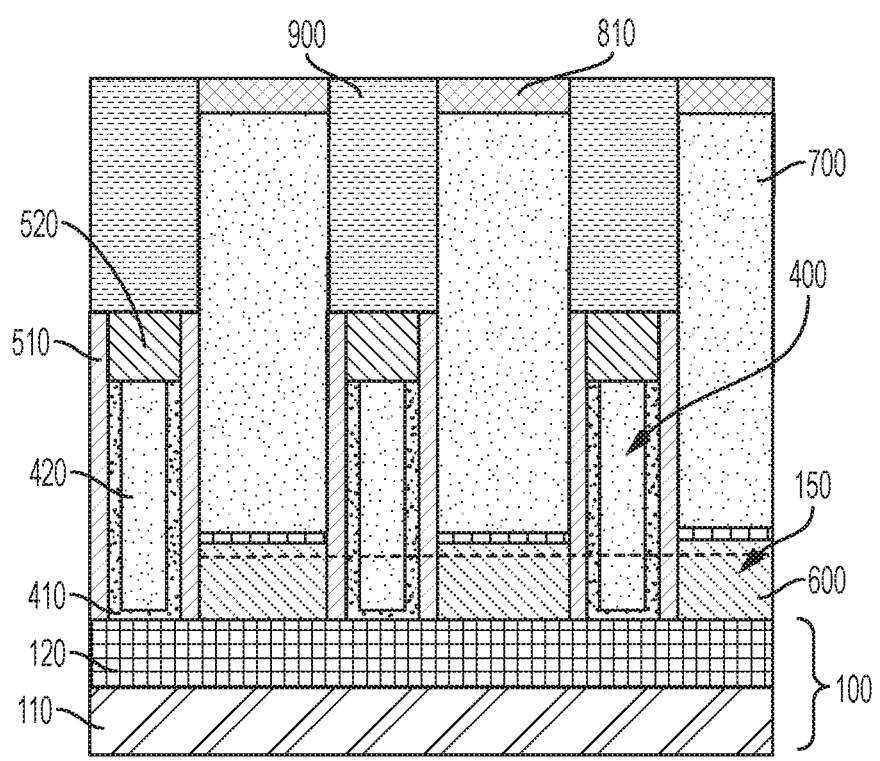
FIG. 1 is a schematic diagram showing a FinFET gate architecture with trench silicide contacts formed using a metal-first deposition method.

Reference will now be made in greater detail to various embodiments of the subject matter of the present application, some embodiments of which are illustrated in the accompanying drawings. The same reference numerals will be used throughout the drawings to refer to the same or similar parts. It is noted that the drawings are provided for illustrative purposes and, as such, may not be drawn to scale.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Embodiments of the application relate generally to the manufacture of semiconductor devices, and more particularly to the manufacture of fin field effect transistors (FinFETS). Exemplary devices include fin field effect transistors having one or more air-gaps between adjacent metal contacts and/or between metal contacts and the transistor gate. Air-gaps may be formed during non-conformal deposition of an isolation dielectric in conjunction with a metal-first process to form conductive structures. As used herein. the term "air-gap" is to include gaps or voids containing air or containing other gaseous dielectrics. such as inert gases, and also gaps containing at least a partial vacuum.

With reference to FIG. 1, a semiconductor device according to various embodiments includes a semiconductor substrate 100 having a plurality of transistor gate structures 400 formed thereon. The gate structures 400 are arranged orthogonal to a plurality of fins (not shown) also formed on the substrate.

Semiconductor substrate 100 may be a semiconductor material such as silicon or a silicon-containing material, including a bulk substrate. Silicon-containing materials include, but are not limited to, single crystal Si, polycrystalline Si, single crystal silicon germanium (SiGe), polycrystalline silicon germanium, silicon doped with carbon (Si:C), amorphous Si, as well as combinations and multilayers thereof. As used herein, the term "single crystal" denotes a crystalline solid in which the crystal lattice of the entire sample is substantially continuous and substantially unbroken to the edges of the sample with substantially no grain boundaries. Example silicon substrates include silicon-on-insulator (SOI) substrates, silicon-on-sapphire (SOS) substrates, and the like.

The substrate 100 is not limited to silicon-containing materials, as the substrate 100 may comprise other semiconductor materials, including Ge and compound semiconductors such as GaAs, InAs and other like semiconductors. In the illustrated embodiment, substrate 100 is a semiconductor-on-insulator (SOI) substrate and comprises, from bottom to top, a supporting substrate 110, an isolation layer 120, and a semiconductor material layer (not shown).

Substrate 100 may have dimensions as typically used in the art. The substrate may comprise a semiconductor wafer. Example wafer diameters include, but are not limited to, 50, 100, 150, 200, 300 and 450 mm, including ranges between any of the foregoing values. The total substrate thickness may range from 250 microns to 1500 microns, although in particular embodiments the substrate thickness is in the range of 725 to 775 microns, which corresponds to thickness dimensions commonly used in silicon CMOS processing. The supporting substrate 110 may comprise (100)-oriented silicon or (111)-oriented silicon, for example.

The isolation layer 120 may comprise the buried oxide (BOX) layer of a semiconductor-on-insulator (SOI) substrate, or an oxidized layer of a bulk silicon substrate. The thickness of the isolation layer 120 may range from 30 to 300 nm, e.g., 30, 50, 100, 150, 200, 250 or 300 nm, including ranges between any of the foregoing values. The isolation layer 120 may comprise, for example, silicon dioxide ($SiO_2$). Alternatively, isolation layer 120 may comprise silicon nitride, silicon oxynitride, a low-k material, or any suitable combination of these materials.

Exemplary low-k materials include but are not limited to, amorphous carbon, fluorine-doped oxides, carbon-doped oxides, SiCOH or SiBCN. Commercially-available low-k dielectric products and materials include Dow Corning's SiLK™ and porous SiLK™, Applied Materials' Black Diamond™, Texas Instrument's Coral™ and TSMC's Black Diamond™ and Coral™. As used herein, a low-k material has a dielectric constant less than that of silicon dioxide.

Disposed over the isolation layer 120 is a semiconductor material layer, which may patterned to define a plurality of fins.

The semiconductor material layer disposed over the isolation layer 120 may comprise any of the semiconductor materials listed above in association with substrate 100. Example semiconductor materials that form the semiconductor material layer, and which may be used for forming semiconductor fins, include silicon (Si), germanium (Ge), silicon germanium (SiGe), III-V compound semiconductors such as GaAs, GaN, GaP, InAs, InSb, ZnSe, and ZnS, and II-VI compound semiconductors such as CdSe, CdS, CdTe, ZnSe, ZnS and ZnTe The supporting substrate 110 and the insulator layer 120 collectively function as a substrate on which a plurality of semiconductor fins are disposed. In various embodiments, each of a plurality of semiconductor fins extends along a lengthwise direction orthogonal to the illustrated gate stacks 400 with a substantially rectangular vertical cross-sectional shape. As used herein, a "substantially rectangular shape" is a shape that differs from a rectangular shape only due to photo-lithographic and process rounding that does not exceed 3 nm. The substantially rectangular vertical cross-sectional shape is a shape within a plane including a vertical direction and a widthwise direction. Plural fins may have identical or substantially identical dimensions, i.e., height and/or width. As used herein, substantially identical dimensions vary by less than 10%, e.g., less than 5%, 2% or 1%.

As used herein, a "fin" refers to a contiguous semiconductor material that includes a pair of vertical sidewalls that are parallel to each other. As used herein, a surface is "vertical" if there exists a vertical plane from which the surface does not deviate by more than three times the root mean square roughness of the surface. Each of a plurality of fins can comprise a single crystal semiconductor material that extends along a lengthwise direction. As used herein, a "lengthwise direction" is a horizontal direction along with an object extends the most. A "widthwise direction" is a horizontal direction that is perpendicular to the lengthwise direction.

The substantially rectangular vertical cross-sectional shape of each fin adjoins a horizontal interface parallel with a top surface of the insulator layer 120. As shown in FIG. 1, the fin height according to certain embodiments is indicated with a dashed line, which is below the height of epitaxial source/drain regions 600.

The semiconductor material forming the fins may be doped, undoped, or contain doped and undoped regions therein. Each doped region within the semiconductor fins may have the same or different doping concentrations and/or conductivities. Doped regions that are present can be formed, for example, by ion implantation, gas phase doping, or by dopants that are present in the material used to form the fins. For instance, the semiconductor material layer from which the fins are defined may comprise a dopant prior to forming the fins. By way of example, the semiconductor layer and hence the fins may be initially and uniformly doped and have a dopant concentration in the range of $1 \times 10^{15}$ atoms/cm$^3$ to $1 \times 10^{18}$ atoms/cm$^3$.

As known to those skilled in the art, a gate architecture 400 is formed over the top surface and opposing sidewalls of the fins. The gate architecture includes a gate dielectric and a gate conductor. Gate dielectric layers may be formed by thermal oxidation, typically at 750-800° C., or alternatively, may be formed by depositing a conformal dielectric layer. The terms "conformal layer" and "conformally deposited layer" denote a layer having a thickness that deviates by no more than 20% (e.g., less than 5, 10 or 20%) from an average thickness of the layer. According to certain embodiments, gate dielectric layers may comprise silicon dioxide, silicon nitride, silicon oxynitride, a high-k dielectric, and/or other suitable material.

As used herein, a high-k material has a dielectric constant greater than that of silicon dioxide. A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, $HfSiO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiO_xN_y$, $SiN_x$, a silicate thereof, and an alloy thereof. Each value of x may independently vary from 0.5 to 3, and each value of y may independently vary from 0 to 2.

The gate dielectric may be deposited by a suitable process such as atomic layer deposition (ALD), chemical vapor deposition (CVD), physical vapor deposition (PVD), thermal oxidation, UV-ozone oxidation, or combinations thereof. The gate dielectric thickness may range from 1 nm to 10 nm, e.g., 1, 2, 4, 6, 8 or 10 nm, including ranges between any of the foregoing. In various embodiments, the gate dielectric includes a thin layer (e.g., 0.5 nm) of silicon dioxide and an overlying layer of high-k dielectric material.

A gate electrode is formed over the gate dielectric layer(s). The gate electrode may include a conductive material such as polysilicon, although amorphous silicon, a combination of amorphous silicon and polysilicon, polysilicon-germanium, or any other appropriate material may be used. When the gate electrode layer is a silicon material, it may be deposited as a doped layer (in situ doping).

In addition, in some embodiments, it might be advantageous to employ a metal gate conductor layer, such as Al, W, Cu, Ti, Ta, W, Pt, Ag, Au, Ru, Ir, Rh and Re, alloys of conductive metals, e.g., Al—Cu, silicides of a conductive metal, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof. The gate electrode may comprise one or more layers of such materials such as, for example, a metal stack including a work function metal layer and/or a liner. In various embodiments, the thickness of the work function metal layer is 3 to 5 nm. In the figures, a metal gate conductor 420 such as a tungsten layer overlies the gate dielectric and work function metal layers, collectively 410.

The gate electrode (e.g., work function metal layer) may be a conformal layer that is formed over exposed surfaces of the structure and then selectively removed to define the desired geometry. The gate electrode can be formed utilizing a conventional deposition process such as, for example, ALD, CVD, metalorganic chemical vapor deposition (MOCVD), molecular beam epitaxy (MBE), PVD, sputtering, plating, evaporation, ion beam deposition, electron beam deposition, laser assisted deposition, or chemical solution deposition.

According to certain embodiments, a next step is to form a thin, low-k dielectric layer on the gate conductor sidewalls and a dielectric layer over the top of the gate stack 400. Nitride spacers 510 are formed on the sidewalls of the gate 400 and a nitride cap 520 is formed over the top of the gate 400. In various embodiments, nitride spacers 510 comprise silicon carbon nitride (SiCN) and nitride cap 520 comprises silicon nitride (e.g., $Si_3N_4$). Amorphous hydrogenated silicon carbon nitride films can be prepared by RF-PECVD from gas mixtures of silane, methane and nitrogen, for example.

A selective etch can be used to form cavities 150 within the semiconductor layer 130 adjacent to the fins, nitride spacers 510, and the gate stacks 400. The cavity-forming etch may be an isotropic or an anisotropic etch, which does not completely undercut the fins. In various embodiments, cavities 150 extend completely through semiconductor layer 130 to isolation layer 120.

Then, using a selective epitaxy process, the cavities 150 are backfilled with a semiconductor material to form, as shown in FIG. 1, source and drain regions 600 adjacent to the fins. It will be appreciated that whenever a region is identified as a source region or a drain region, it is only for convenience as the source and drain regions may be interchanged as understood in the art.

The terms "epitaxy," "epitaxial" and/or "epitaxial growth and/or deposition" refer to the formation of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. For example, an epitaxial semiconductor material deposited on a (100) crystal surface will take on a (100) orientation. Source/drain regions 600 may comprise silicon, silicon germanium, or another suitable semiconductor material.

An example silicon epitaxial process for forming silicon source (or drain) region(s) uses a gas mixture comprising hydrogen ($H_2$) and dichlorosilane ($SiH_2Cl_2$) at a deposition (e.g., substrate) temperature of 600-800° C. Other suitable gas sources for silicon epitaxy include silicon tetrachloride ($SiCl_4$), silane ($SiH_4$), trichlorosilane ($SiHCl_3$), and other hydrogen-reduced chlorosilanes ($SiH_xCl_{4-x}$).

In various embodiments, the selective epitaxy process deposits an epitaxial layer directly onto the exposed isolation layer 120 within cavities 150. Selective epitaxial layers may be formed using molecular beam epitaxy or chemical vapor deposition processes that are adapted for selective epitaxy. The thickness of the source and drain regions 600 may range from 15 to 40 nm, e.g., 15, 20, 25, 30, 35 or 40 nm, including ranges between any of the foregoing values.

In various embodiments, source and drain regions are doped. For instance, doping may occur during epitaxial growth, i.e., the source and drain regions are doped in situ. As known to those skilled in the art, doping changes the electron and hole carrier concentrations of an intrinsic semiconductor at thermal equilibrium. A doped layer or region may be p-type or n-type. A p-type dopant is used to manufacture a PFET and an n-type dopant is used to manufacture an NFET.

As used herein, "p-type" refers to the addition of impurities to an intrinsic semiconductor that creates a deficiency of valence electrons. For silicon, example p-type dopants, i.e., impurities, include but are not limited to, boron, aluminum, gallium, and indium. As used herein, "n-type" refers to the addition of impurities that contribute free electrons to an intrinsic semiconductor. For silicon, example n-type dopants, i.e., impurities, include but are not limited to, antimony, arsenic, and phosphorus. The dopant(s) may be introduced by plasma doping, or may be introduced, for example, in situ, i.e., during the process sequence used to form the layer.

By way of example, a dopant region, e.g., source and/or drain region, may be in situ doped with arsenic or phosphorus to form an n-type region. The dopant concentration within the source and drain regions 600 may range from $1\times10^{19}$ atoms/cm$^3$ to $1\times10^{22}$ atoms/cm$^3$, e.g., $1\times10^{20}$ atoms/cm$^3$ to $1\times10^{21}$ atoms/cm$^3$. In another example, a dopant region is in situ doped with boron to form a p-type region. The dopant concentration within the source and drain regions may range from $1\times10^{19}$ atoms/cm$^3$ to $1\times10^{22}$ atoms/cm$^3$, e.g., $1\times10^{20}$ atoms/cm$^3$ to $1\times10^{21}$ atoms/cm$^3$.

An optional drive-in annealing can be used to diffuse dopant species and generate a desired dopant profile. In embodiments, dopant atoms within the source and drain regions 600 may be diffused into the adjacent fins using a post-epitaxy annealing (e.g., at a temperature of 600 to 1400° C.) to create a dopant profile within the fins proximate to the source and drain regions 600. The dopant profile within the fins may be constant or variable. For instance, the dopant concentration within the fins may vary laterally, with a minimum dopant concentration (e.g., $1\times10^{19}$ to $1\times10^{22}$ atoms/cm$^3$) along a central axis of the fins and a maximum dopant concentration (e.g., $1\times10^{19}$ to $1\times10^{22}$ atoms/cm$^3$) at opposing surfaces thereof.

Figure 2:
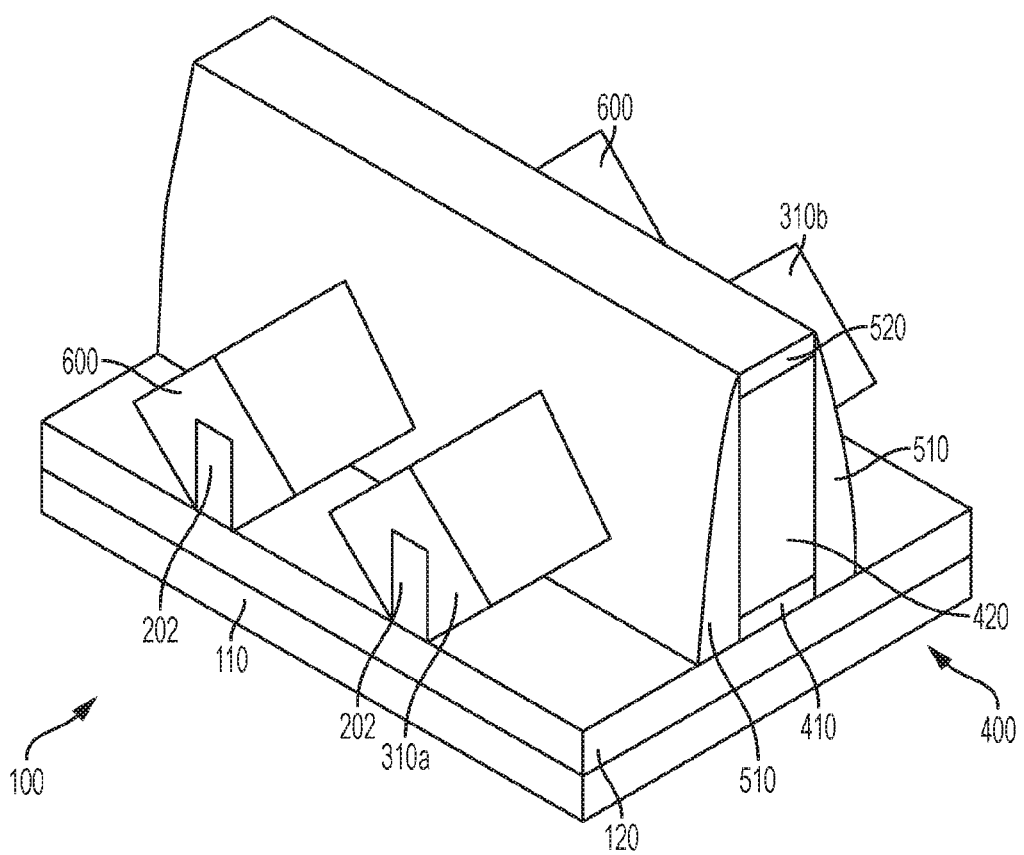
FIG. 2 is a perspective view of a semiconductor device architecture at an intermediate stage of fabrication according to various embodiments.

With reference to FIG. 2, a semiconductor structure according to further embodiments includes a substrate 100 having a plurality of fins 202 formed on an isolation layer 120 of the substrate. In the illustrated embodiment, epitaxial source and drain regions include raised active regions 310a, 310b that are formed over the fins 202 at opposing ends thereof, while a gate stack 400 is formed over the fins 202 defining a channel region between the source and drain regions.

The portion of each semiconductor fin 202 that is not converted into a source region or a drain region constitutes a channel region. The channel regions collectively function as a channel of a field effect transistor. The source regions including raised source regions 310a collectively function as a source of the field effect transistor. The drain regions including raised drain regions 310b collectively function as a drain of the field effect transistor.

Electrical contacts to the source, drain and gate may be formed. Methods of forming the contacts according to various embodiments are described with reference FIGS. 3A-3I. Exemplary structures showing the electrical contacts are illustrated in FIGS. 1 and 4-9, which are cross-sectional views taken perpendicular to the fins.

Referring to FIG. 3A, shown is a cross-sectional view of a post-replacement metal gate (RMG) device architecture at an intermediate stage of fabrication with gate stacks 400 disposed over semiconductor substrate 100, and epitaxial source/drain regions 600 disposed over the isolation layer 120 of the substrate adjacent to the gate stacks 400. The gate stacks 400, including gate electrode layers 410 and metal gate conductors 420, have been recessed below the top surface of the nitride spacers 510 and a sacrificial oxide layer 650.

As seen in FIG. 3B, a blanket nitride layer 520 is deposited over the structure of FIG. 3A, i.e., directly over sacrificial oxide layer 650 and recessed gate stacks 400. The nitride layer 520 is planarized, typically using a chemical mechanical polishing process. Chemical mechanical polishing (CMP) is a material removal process that uses both chemical reactions and mechanical forces to remove material and planarize a surface. The sacrificial oxide layer 650 may serve as a planarization etch stop, which exposes a top surface of the sacrificial oxide layer 650.

Figure 3D:
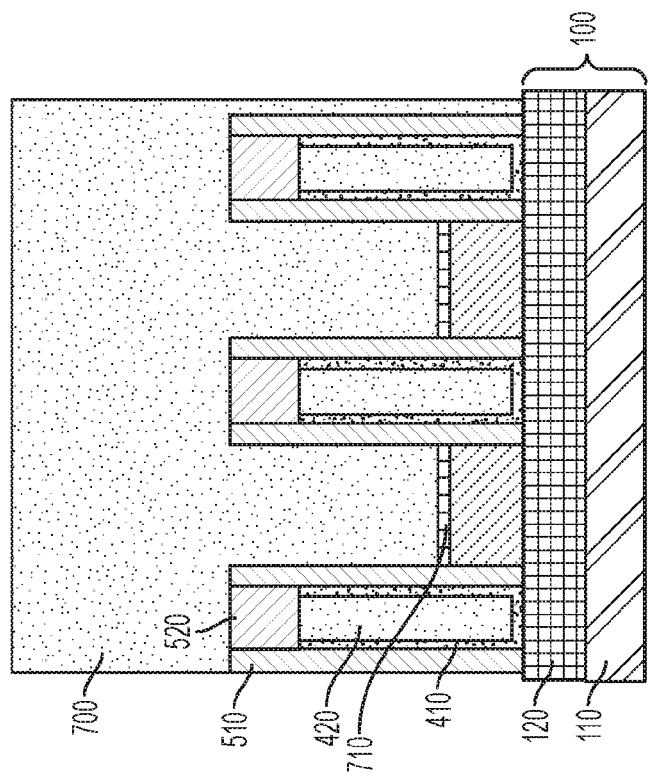
Figure 3C:
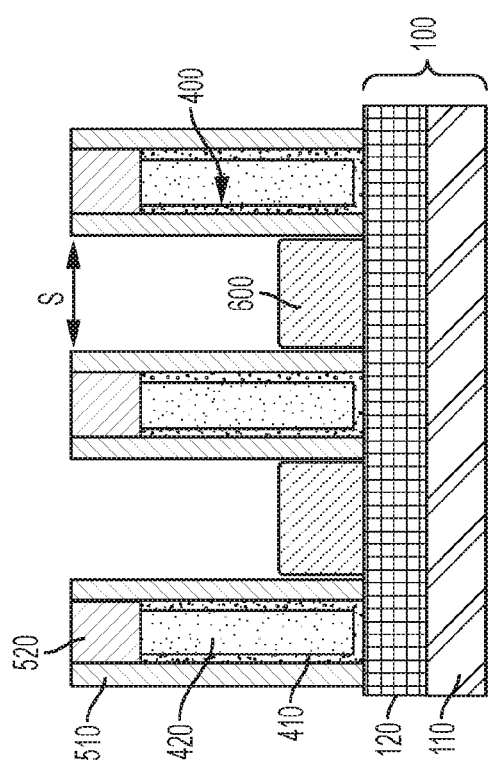

As seen in FIG. 3C, the sacrificial oxide layer 650 is removed using a selective etch, exposing top surfaces of epitaxial layers 600. Exemplary etch processes that may be used to remove the sacrificial oxide layer 650 selective to the gate and the source/drain regions include a buffered oxide (I-IF) wet etch or a Siconi™ plasma etch. The spacing (S) between adjacent gate structures may range from 10 to 50 nm, e.g., 10, 20, 30, 40 or 50 nm, including ranges between any of the foregoing values.

Source/drain silicide regions 710 are formed on source/drain regions 600. The formation of silicide regions 710 may include a self-aligned silicide (salicide) process. The silicide process includes blanket deposition of a metal layer (not shown), followed by annealing to cause a reaction between the metal layer and the underlying silicon within source/drain regions 600. Optionally, unreacted portions of the metal layer may be removed. The metal layer may include titanium, nickel, cobalt, titanium nitride, or the like, as well as combinations thereof. By way of example, the metal layer may include a layer of titanium (5 nm) and a layer of titanium nitride (10 nm). During the annealing, titanium metal reacts with silicon to form titanium silicide.

Referring to FIG. 3D, a blanket metal layer 700 is then deposited over the gate stacks 400, i.e., in contact with nitride spacers 510 and nitride cap 520, and over source/drain regions 600 in contact with the silicide regions 710. Metal layer 700 may be deposited by evaporation, sputtering, or other known physical vapor deposition (PVD) techniques, and then planarized using chemical mechanical polishing.

Figure 3F:
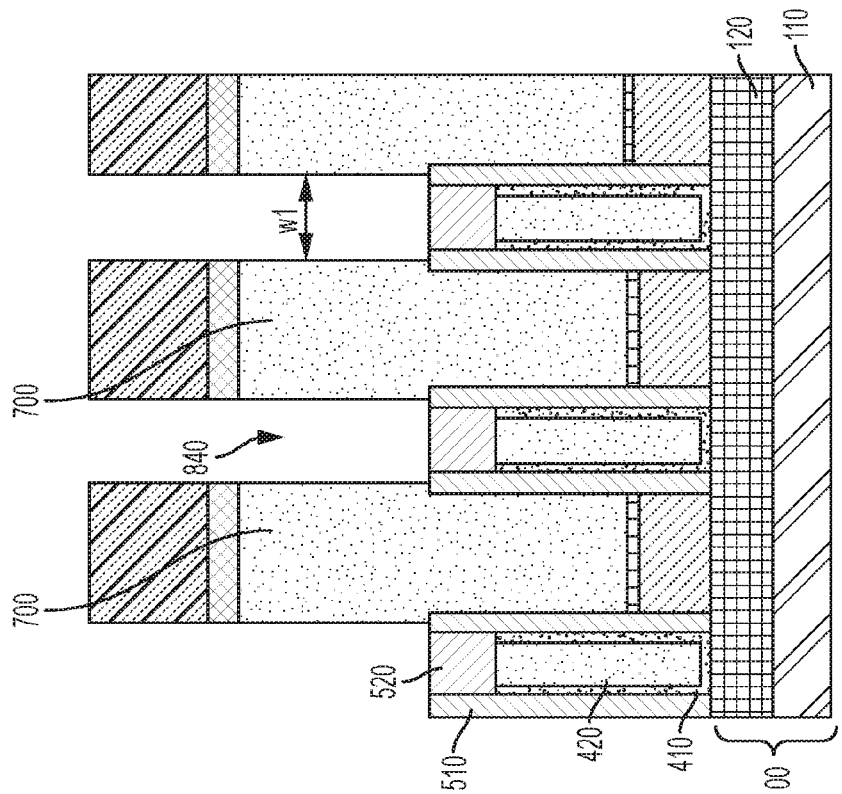
Figure 3E:
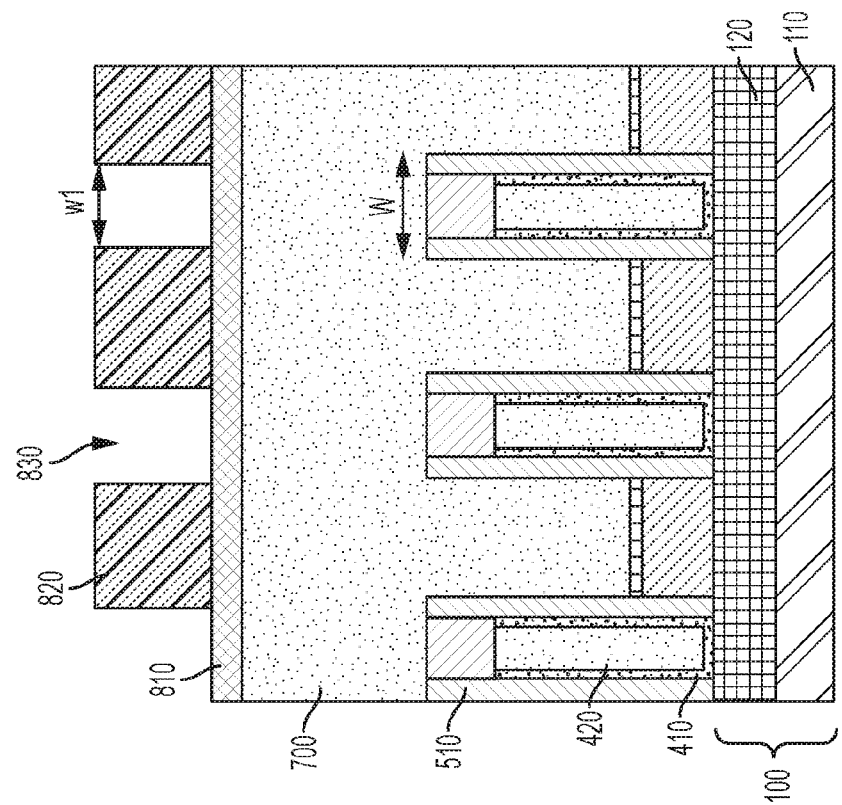

As seen with reference to FIG. 3E, a masking layer 810 and photoresist layer 820 are deposited in succession over the metal layer 700. Masking layer 810 may have a thickness of 10 to 100 nm, and comprise SiON, SiN or SiO$_2$, for example. The photoresist layer 820 may include a positive-tone photoresist composition, a negative-tone photoresist composition, or a hybrid-tone photoresist composition. The layer of photoresist material may be formed by a deposition process such as, for example, spin-on coating.

The deposited photoresist is then subjected to a pattern of irradiation, and the exposed photoresist material is developed using a conventional resist developer. The pattern of openings 830 provided by the patterned photoresist material is thereafter transferred into the underlying material layer or material layers utilizing at least one pattern transfer etching process.

The pattern transfer etching process may be an isotropic etch or an anisotropic etch. In various embodiments, a dry etching process such as, for example, reactive ion etching (RIE) can be used. In other embodiments, a wet chemical etchant can be used. In still further embodiments, a combination of dry etching and wet etching can be used. As seen with reference to FIG. 3F, a substantially anisotropic pattern transfer etch of metal layer 700 stops on the nitride spacers 510 and nitride cap 520 to define isolation apertures 840. The patterned photoresist may be consumed during the etch process, stripped after etching of the metal layer has been completed, or removed by ashing.

According to various embodiments, a nitrogen plasma treatment can be used to form a thin (e.g., 2-4 nm) nitride passivating layer over exposed surfaces of metal layer 700, i.e., within the isolation apertures. As illustrated in FIGS. 1 and 4-9, the isolation apertures 840 may then be at least partially filled with a conformal or non-conformal isolation dielectric 900. According to various embodiments, conformal deposition of the isolation dielectric 900 substantially fills the isolation apertures 840, while non-conformal deposition of the isolation dielectric 900 will partially fill the isolation apertures 940 forming an air-gap therein.

Conformal layers of electrically stable silicon dioxide, for example, can be deposited by chemical vapor deposition using silane ($SiH_4$) and nitrous oxide ($N_2O$) source gases at high flow rates of nitrous oxide. In the illustrated view, the remaining portions of the metal layer 700 provide contact structures to the source and drain 600. Though not illustrated, it will be appreciated that other remaining portions of the metal layer 700 may provide contact to the gate.

In the embodiment illustrated in FIGS. 3E and 3F, the width (w1) of the isolation aperture 840 is less than or equal to the width (W) of the gate stack 400. A corresponding structure after conformally filling the isolation apertures 840 with a dielectric material 900 is shown in FIG. 1, where the dielectric material 900 substantially fills the isolation aperture 840 and is disposed over the gate stack 400. A chemical mechanical polishing step can be used to planarize the dielectric layer 900 with respect to a top surface of the masking layer 810 or a top surface of the metal layer 700.

Figure 3I:
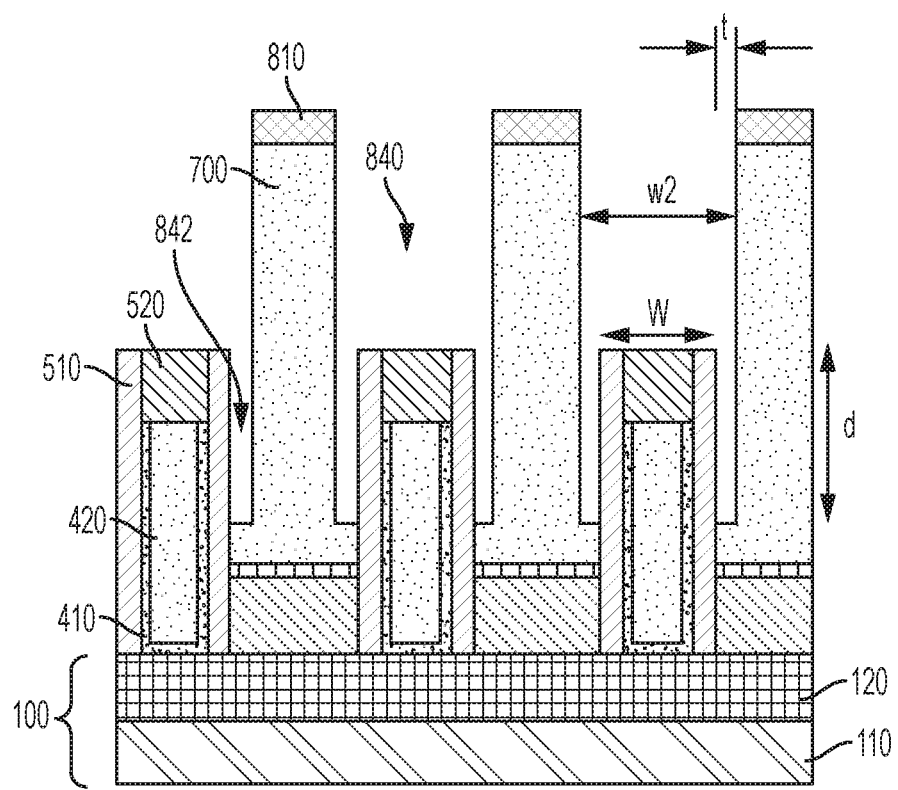

According to a further embodiment, as illustrated in FIGS. 3G-3I, the width (w2) of the isolation aperture 840 is greater than the width (W) of the gate stack 400. Thus, as seen in FIG. 3H, an anisotropic pattern transfer etch of the metal layer 700 may stop, as one embodiment, on the nitride spacers 510 and nitride cap 520 defining isolation apertures 840 above gate stack 400. Referring to FIG. 3I, the anisotropic pattern transfer etch may also selectively remove portions of the metal layer 700 adjacent to the gate 400 and extend the isolation aperture 840 to a depth (d) below a top surface of the gate stack 400, where the thickness (t) of the extended isolation aperture 842, assuming the etch pattern is aligned with the gate stack, can be expressed as (w2−W)/2. The isolation aperture 840 and extended isolation aperture 842 may then be filled with an isolation dielectric 900.

Figure 4:
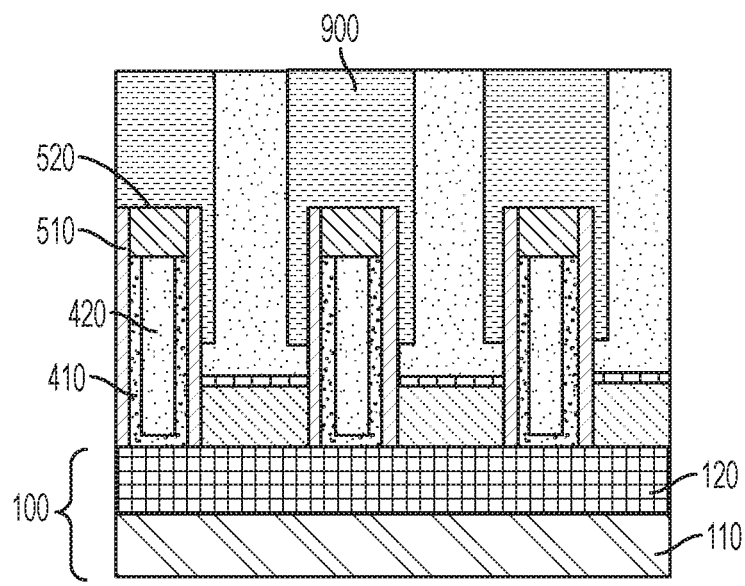
FIG. 4 shows a FinFET gate architecture with a portion of a dielectric isolation layer disposed over sidewalls of the transistor gate architecture.

A corresponding device structure after conformally filling the isolation apertures 840 and the extended isolation aperture 842 is shown in FIG. 4, where dielectric material 900 is disposed over the gate stack 400 as well as over a portion of the gate stack sidewalls, i.e., directly over nitride spacers 510 between the gate and the metal layer 700. It will be appreciated that while the extended isolation aperture 842 extends below the top surface of the gate stack 400, the depth (d) of the extended isolation aperture 842 is less than the height of the gate stack above source/drain 600 such that the dielectric material 900 does not directly contact source/drain regions 600 or source/drain silicide regions 710.

Figure 5:
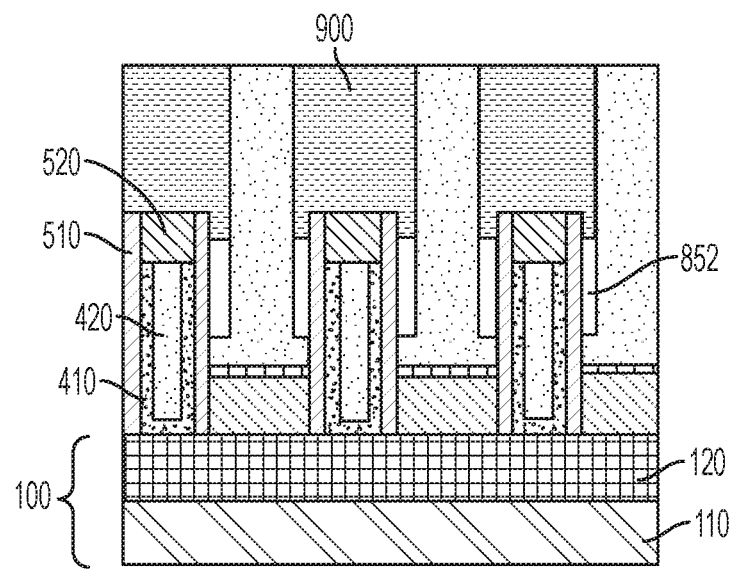
FIG. 5 shows air-gaps between the FinFET gate and the trench metallization proximate to the gate sidewalls according to one embodiment.

As seen with reference to FIG. 5, air-gaps 852 may be formed adjacent to the gate stack 400 within the extended isolation apertures 842 by using a directional deposition process such that the dielectric material 900 fills isolation apertures 840 and only an upper portion of the extended isolation apertures 842. In various embodiments, the width of such air-gaps 852 may be 1 to 10 nm.

According to further embodiments, as an alternative to, or in addition to, air-gaps disposed over the sides of the gate 400, air-gaps may be formed over the top of the gate. Example device structures having an air-gap disposed within the isolation dielectric 900 over the top of the gate stack are shown in FIGS. 6-9.

Figure 6:
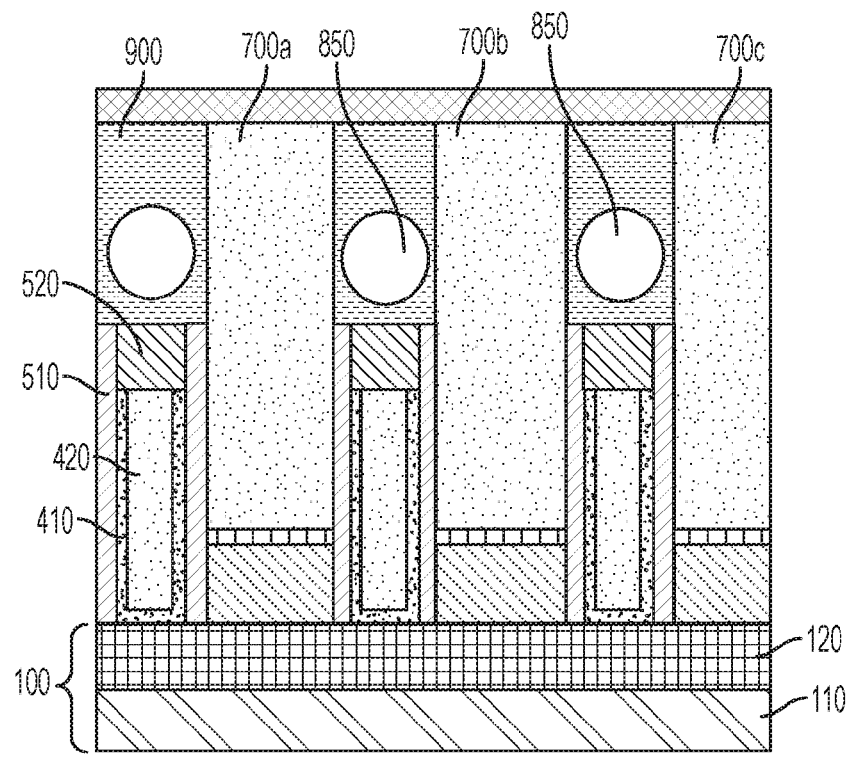
FIG. 6 is a schematic diagram showing air-gaps within the isolation dielectric over the top of a FinFET gate according to one embodiment.
Figure 7:
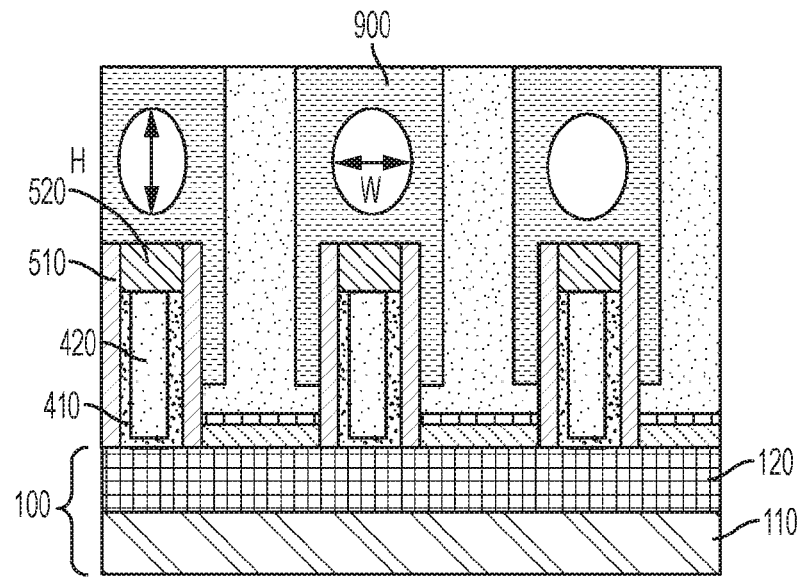
FIG. 7 shows air-gaps within the isolation dielectric over the top of a FinFET gate with the isolation dielectric extending over the gate sidewalls.
Figure 8:
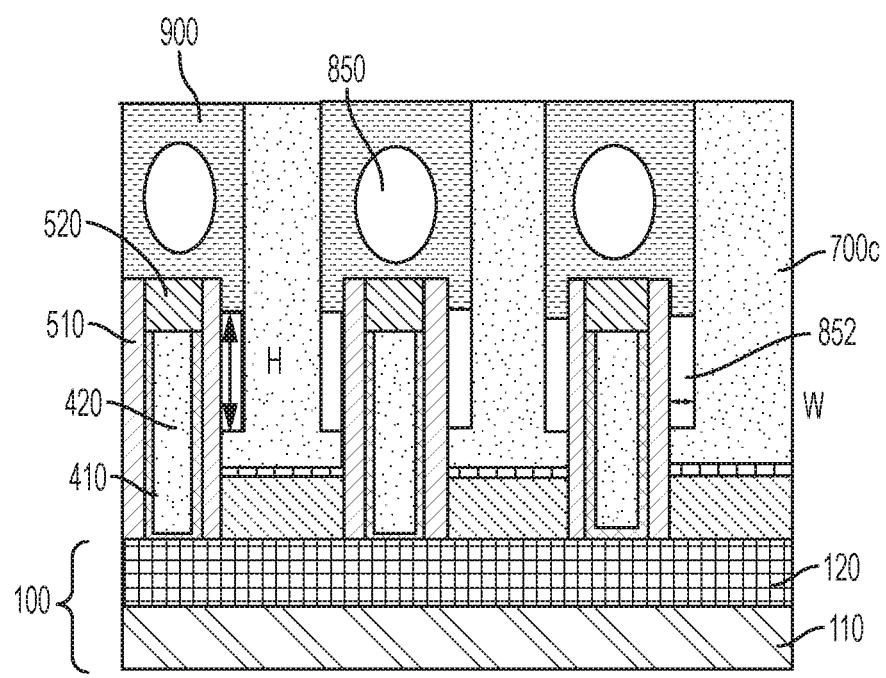
FIG. 8 shows air-gaps within the isolation dielectric over the top of a FinFET gate and over the gate sidewalls between the gate and the trench metallization according to various embodiments.

The structures of FIGS. 6-8 are analogous to the structures of FIGS. 1, 4 and 5. However, in lieu of conformally depositing dielectric layer 900 to substantially fill isolation apertures 840, a non-conformal dielectric layer is deposited within the isolation apertures 840 over the top of the gate 400 and over exposed sidewalls of metal layer 700. As shown in FIG. 6, for example, the non-conformal process will form an air-gap 850 between adjacent metal contacts 700a, 700b, 700c above the gate. In various embodiments, the device architecture is configured such that a top surface of metal contacts 700a, 700b, 700c are above a top surface of the gate.

According to various embodiments, a non-conformal dielectric layer may comprise a plasma-enhanced chemical vapor deposited (PECVD) oxide, which will deposit over both the top surface of the nitride cap 520, as well as over the sidewalls of the metal layer 700 within the isolation apertures 840. Alternatively, a non-conformal dielectric layer can be deposited using a high density plasma (HDP) deposition process.

With reference to FIGS. 7 and 8, air gaps 850 and 852 have a height H and width W. The air gap height may range from 15 to 50 nm, for example. The air gap width (W) may range from 1 to 50 nm, for example. In various embodiments, the height (H) of air gap 852 is 30 to 95% of the height of the gate stack. In various embodiments, the width (W) of air gap 852 is 30 to 100% of the distance from the sidewall spacer 510 to the metal contact.

Figure 9:
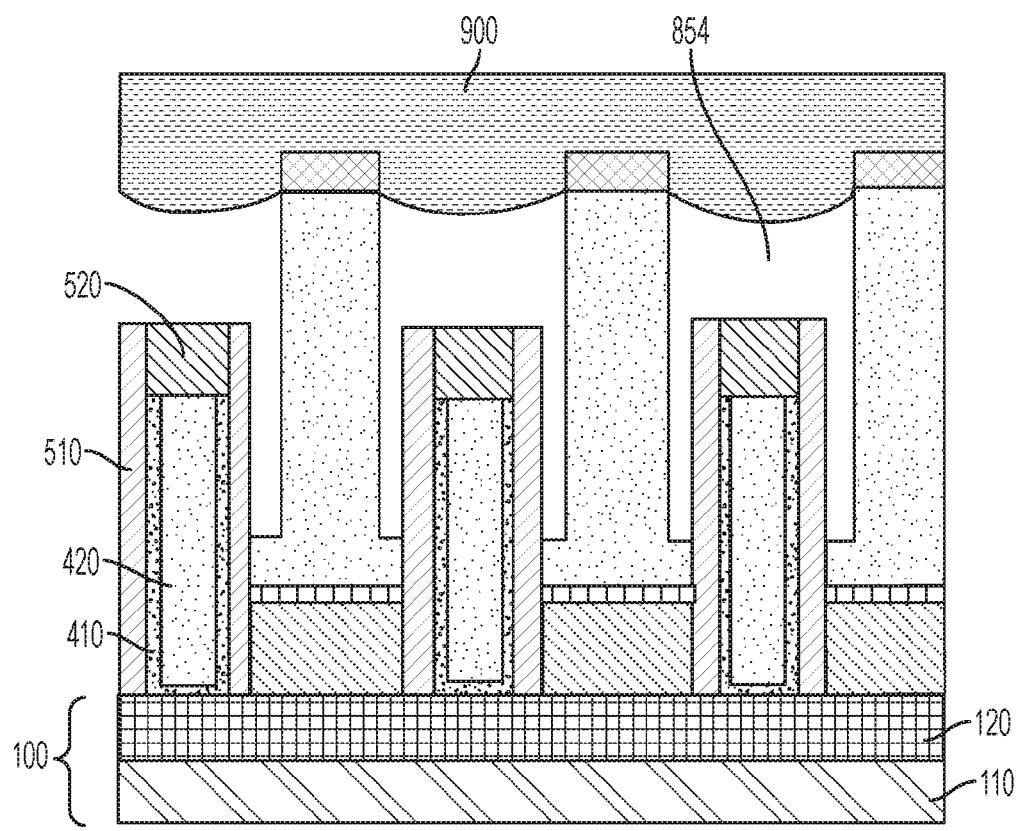
FIG. 9 shows merged air-gaps over the top of a FinFET gate stack and over the gate sidewalls between the gate and the trench metallization.

Referring to FIG. 9, illustrated is a further embodiment where the dielectric layer 900 extends partially into the isolation aperture forming an interconnected air-gap 854 that extends from over the gate to the gate sidewalls. Such a merged air-gap 854, or discrete air-gaps 850, 852, provide robust electrical isolation between adjacent conductive elements, which will decrease inter-contact capacitance and accordingly improve the performance of semiconductor devices, including FinFET devices.

The FinFET devices according to the present application may be used in conjunction with a variety of different circuits, such as high performance logic, low power logic or high density memory devices, including high density multi-gigabit DRAMs. Furthermore, FinFET-based devices may be combined with other elements, such as capacitors, resistors, diodes, memory cells, and the like.

The present application provides a device architecture and manufacturing method that overcome many of the deficiencies of conventional structures and methods. Specifically, the device structure is enabled by a robust method and provides the ability to form advanced node FinFET devices exhibiting minimal signal path capacitance.

While various embodiments relating to the formation of air-gaps are described herein in relation to a FinFET device, it will be appreciated that the metal-first process and the accompanying structures may be used in conjunction with the manufacture of other logic platforms, including planar (two-dimensional) transistor structures.

As used herein, the singular forms "a," "an" and "the" include plural referents unless the context clearly dictates otherwise. Thus, for example, reference to a "dielectric layer" includes examples having two or more such "dielectric layers" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

As used herein, an element such as a layer or region that is "on" or "over" or "disposed over" a substrate or other layer refers to formation above, or in contact with, a surface of the substrate or layer. For example, where it is noted or recited that a layer is disposed over a substrate or other layer, it is contemplated that intervening structural layers may optionally be present between the layer and the substrate. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

While various features, elements or steps of particular embodiments may be disclosed using the transitional phrase "comprising," it is to be understood that alternative embodiments, including those that may be described using the transitional phrases "consisting essentially of" or "consisting," are implied. Thus, for example, implied alternative embodiments to a gate dielectric that comprises silicon dioxide and a high-k dielectric include embodiments where a gate dielectric consists essentially of silicon dioxide and a high-k dielectric and embodiments where a gate dielectric consists of silicon dioxide and a high-k dielectric.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed as new is:

1. A method of forming a semiconductor device, comprising:
    forming a gate structure over a channel region of a semiconductor fin, wherein a source region and a drain region are present on opposing sides of the channel region;
    forming dielectric spacers over sidewalls of the gate structure and a dielectric cap over a top of the gate structure;
    forming a conductive layer over the dielectric cap, and over the source region and the drain region between the dielectric spacers of adjacent gate structures;
    forming an isolation aperture through the conductive layer to a top surface of the dielectric cap; and
    forming a dielectric layer within the isolation aperture, wherein a first air gap is formed within the dielectric layer during formation of the dielectric layer, and wherein the isolation aperture extends over sidewalls of the dielectric spacers, and forming the dielectric layer comprises non-conformally depositing the dielectric layer into the isolation aperture and forming the first air gap within the dielectric layer over the top of the gate structure and forming a second air gap over sidewalls of the dielectric spacers.

2. The method of claim 1, wherein forming the dielectric layer comprises non-conformally depositing the dielectric layer into the isolation aperture and forming the second air gap beneath the dielectric layer over sidewalls of the dielectric spacers.

3. The method of claim 1, wherein the first air gap over the top of the gate structure and the second air gap over the sidewalls of the dielectric spacers are merged.

4. The method of claim 1, wherein the first air gap is entirely surrounded by the dielectric layer.

5. A semiconductor device, comprising:
    a semiconductor fin disposed over a semiconductor substrate;
    a gate structure disposed over a channel region of the semiconductor fin;
    source and drain regions on opposing sides of the channel region;
    dielectric spacers over sidewalls of the gate structure and a dielectric cap over the top of the gate structure;
    a conductive layer over the source region and the drain region between the dielectric spacers of adjacent gate structures; and
    an isolation dielectric disposed over the top of the gate structure and extending over sidewalls of the dielectric spacers, wherein the isolation dielectric comprises a first air gap over the top of the gate structure entirely surrounded by the isolation dielectric, and a second air gap over sidewalls of the dielectric spacers.

6. The semiconductor device of claim 5, wherein a width of the air gap ranges from 30% to 95% of a width of the gate structure.

7. The semiconductor device of claim 5, wherein the isolation dielectric extending over the sidewalls of the dielectric spacers does not contact the source and drain regions.

8. The semiconductor device of claim 5, wherein the height of the second air gap over the sidewalls of the dielectric spacers ranges from 30% to 95% of a height of the gate structure.

9. The semiconductor device of claim 5, wherein a top surface of the conductive layer is above a top surface of the gate structure.

10. The semiconductor device of claim 5, wherein the dielectric spacers comprise silicon carbon nitride and the dielectric cap comprises silicon nitride.

11. The semiconductor device of claim 5, wherein the isolation dielectric comprises silicon dioxide.

* * * * *